(12) United States Patent
Choi

(10) Patent No.: US 8,598,928 B1
(45) Date of Patent: Dec. 3, 2013

(54) DELAY-LOCKED LOOP

(75) Inventor: Hoon Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,242

(22) Filed: Sep. 3, 2012

(30) Foreign Application Priority Data

May 25, 2012 (KR) .......................... 10 2012 0056117

(51) Int. Cl.
*H03L 7/06* (2006.01)

(52) U.S. Cl.
USPC ............................ 327/158; 327/142; 327/149

(58) Field of Classification Search
USPC .................. 327/142, 143, 149, 158, 161, 198
See application file for complete search history.

(56) References Cited

U.S. PATENT DOCUMENTS

| | | | | |
|---|---|---|---|---|
| 7,388,415 | B2 * | 6/2008 | Lee | 327/158 |
| 7,449,930 | B2 * | 11/2008 | Hur | 327/158 |
| 7,489,170 | B2 * | 2/2009 | Ku et al. | 327/158 |
| 8,487,679 | B2 * | 7/2013 | Kim et al. | 327/158 |

FOREIGN PATENT DOCUMENTS

KR 1020070036643 A 4/2007

* cited by examiner

*Primary Examiner* — Patrick O'Neill
(74) *Attorney, Agent, or Firm* — William Park & Associates Patent Ltd.

(57) ABSTRACT

A semiconductor apparatus includes a DLL clock generation unit configured to compare phases of a clock and a feedback clock, determine a delay time of a delay line, delay the clock by the delay time through the delay line, and generate a DLL clock; a delay detection unit configured to detect the delay time of the delay line and enable a delay detection signal when the delay time is greater than or equal to a predetermined time; and a power-down control unit configured to prevent the DLL clock generation unit from being reset when the delay detection signal is enabled and reset the DLL clock generation unit when the delay detection signal is disabled, in a self-refresh operation under a power-down mode.

14 Claims, 5 Drawing Sheets

DELAY-LOCKED LOOP

CROSS-REFERENCES TO RELATED APPLICATION

The present application claims priority under 35 U.S.C. §119(a) to Korean application number 10-2012-0056117, filed on May 25, 2012, in the Korean Intellectual Property Office, which is incorporated herein by reference in its entirety.

BACKGROUND

1. Technical Field

The present invention relates generally to a semiconductor integrated circuit, and more particularly, to a semiconductor apparatus.

2. Related Art

A semiconductor apparatus receives a clock and operates in synchronization with the received clock. In order for the semiconductor apparatus to output a signal synchronized with the received clock, the semiconductor apparatus internally generates a delay-locked clock (DLL).

Referring to FIG. 1, a conventional semiconductor apparatus includes a DLL clock generation unit 10, an output enable signal generation unit 20, and a power-down control unit 30.

The DLL clock generation unit 10 receives a clock CLK and generates a DLL clock CLK_dll, and is activated or deactivated in response to a reset signal Reset.

The DLL clock generation unit 10 includes a buffer 11, a delay line 12, a replica 13, a phase comparing section 14, and a delay control section 15.

The buffer 11 buffers the clock CLK when activated and generates a buffering clock CLK_bf when a buffer enable signal Buf_en is enabled, and is deactivated and locks the buffering clock CLK_bf to a specified level when the buffer enable signal Buf_en is disabled.

The delay line 12 determines a delay time in response to delay control signals ctrl_dl<0:4>, delays the buffering clock CLK_bf by the determined delay time, and outputs the DLL clock CLK_dll.

The replica 13 delays the DLL clock CLK_dll and outputs a feedback clock CLK_fb. The delay time of the replica 13 is set as is the internal delay time of the semiconductor apparatus as modeled.

The phase comparing section 14 compares the phases of the feedback clock CLK_fb and the buffering clock CLK_bf, and generates a comparison signal com_s.

The delay control section 15 generates the delay control signals ctrl_dl<0:4> in response to the comparison signal com_s. For example, the delay control section 15 outputs the delay control signals ctrl_dl<0:4> of (0, 0, 1, 0, 0) as an initial value, outputs the delay control signals ctrl_dl<0:4> of (0, 1, 0, 0, 0) or (1, 0, 0, 0, 0) when the comparison signal com_s is enabled, and outputs the delay control signals ctrl_dl<0:4> of (0, 0, 0, 1, 0) or (0, 0, 0, 0, 1) when the comparison signal com_s is disabled.

The output enable signal generation unit 20 receives a read command signal RD_cmd, outputs an output enable signal OE_signal when a preset cycle of the DLL clock CLK_dll elapses thereafter, and is activated or deactivated in response to the reset signal Reset.

The power-down control unit 30 generates the buffer enable signal Buf_en and the reset signal Reset in response to a clock enable signal CKE and a self-refresh signal Sref. For example, the power-down control unit 30 disables the buffer enable signal Buf_en when the clock enable signal CKE is disabled. Also, the power-down control unit 30 enables the reset signal Reset when the clock enable signal CKE is disabled and the self-refresh signal Sref is enabled.

In a power-down mode of the conventional semiconductor apparatus when a state in which the clock enable signal CKE is disabled, the buffer 11 of the DLL clock generation unit 10 is deactivated. Accordingly, the delay line 12 of the DLL clock generation unit 10 maintains a delay time before the buffer 11 is deactivated.

When entering a self-refresh mode from the power-down mode, both the DLL clock generation unit 10 and the output enable signal generation unit 20 are deactivated.

If the power-down mode accompanied with these operations frequently occurs, the DLL clock generation unit 10 and the output enable signal generation unit 20, which operate by receiving the output signal of the DLL clock generation unit 10, are repeatedly activated and deactivated, by which the likelihood of a misoperation increases.

SUMMARY

In an embodiment of the present invention, a semiconductor apparatus includes: a DLL clock generation unit configured to compare phases of a clock and a feedback clock, determine a delay time of a delay line, delay the clock by the delay time through the delay line, and generate a DLL clock; a delay detection unit configured to detect the delay time of the delay line and enable a delay detection signal when the delay time is greater is than or equal to a predetermined time; and a power-down control unit configured to prevent the DLL clock generation unit from being reset when the delay detection signal is enabled and reset the DLL clock generation unit when the delay detection signal is disabled, in a self-refresh operation under a power-down mode.

In another embodiment of the present invention, a semiconductor apparatus includes: a buffer configured to buffer a clock and generate a buffering clock; a delay line configured to determine a delay time in response to a plurality of delay control signals, delay the buffering clock by the determined delay time, and output a DLL clock; a replica configured to delay the DLL clock and output a feedback clock; a phase comparing section configured to compare phases of the buffering clock and the feedback clock and generate a comparison signal; a delay control section configured to generate the plurality of delay control signals in response to the comparison signal; a delay detection unit configured to generate a delay detection signal in response to the plurality of delay control signals; and a power-down control unit configured to activate or deactivate the buffer in response to the delay detection signal in a power-down mode.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through various embodiments.

Figure 1:
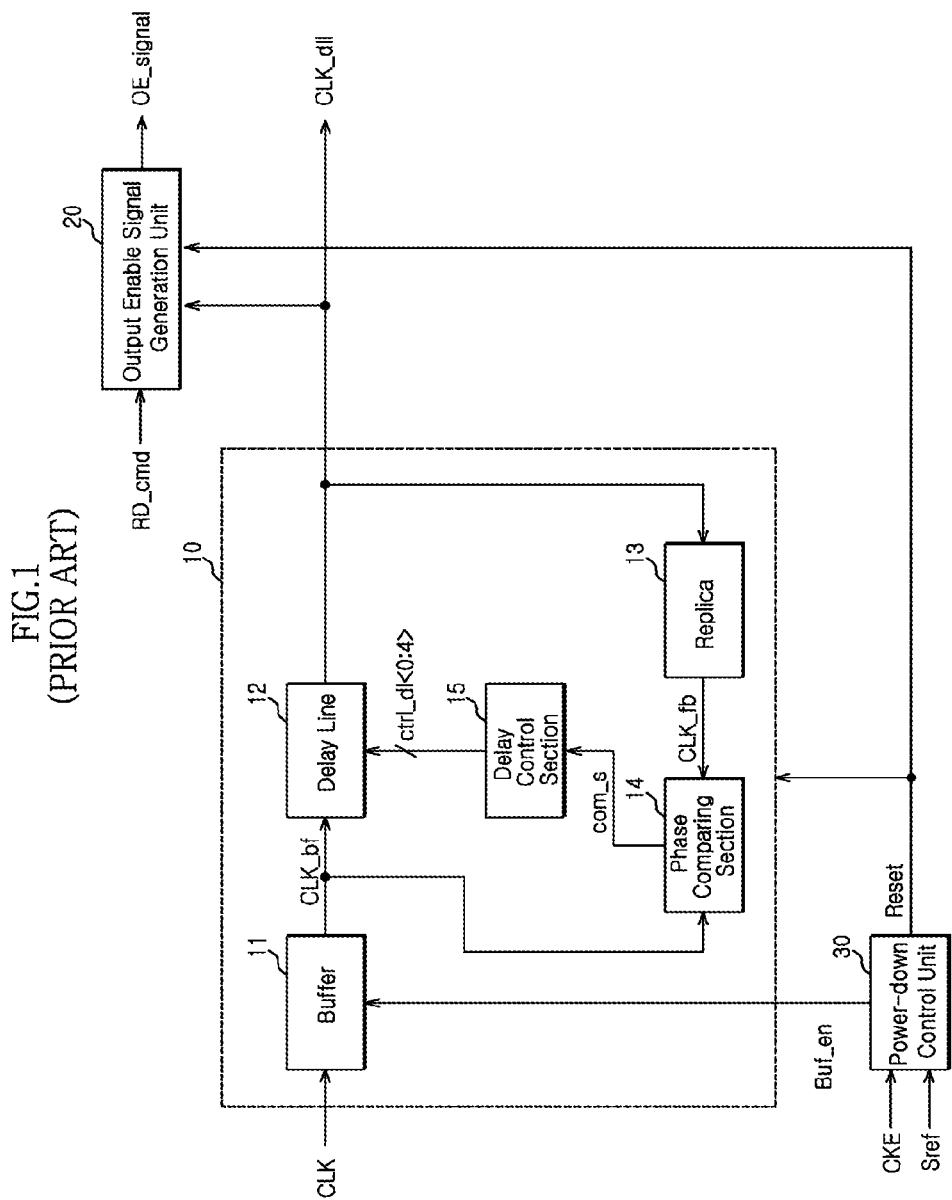
FIG. 1 is a configuration diagram of a conventional semiconductor apparatus.
Figure 2:
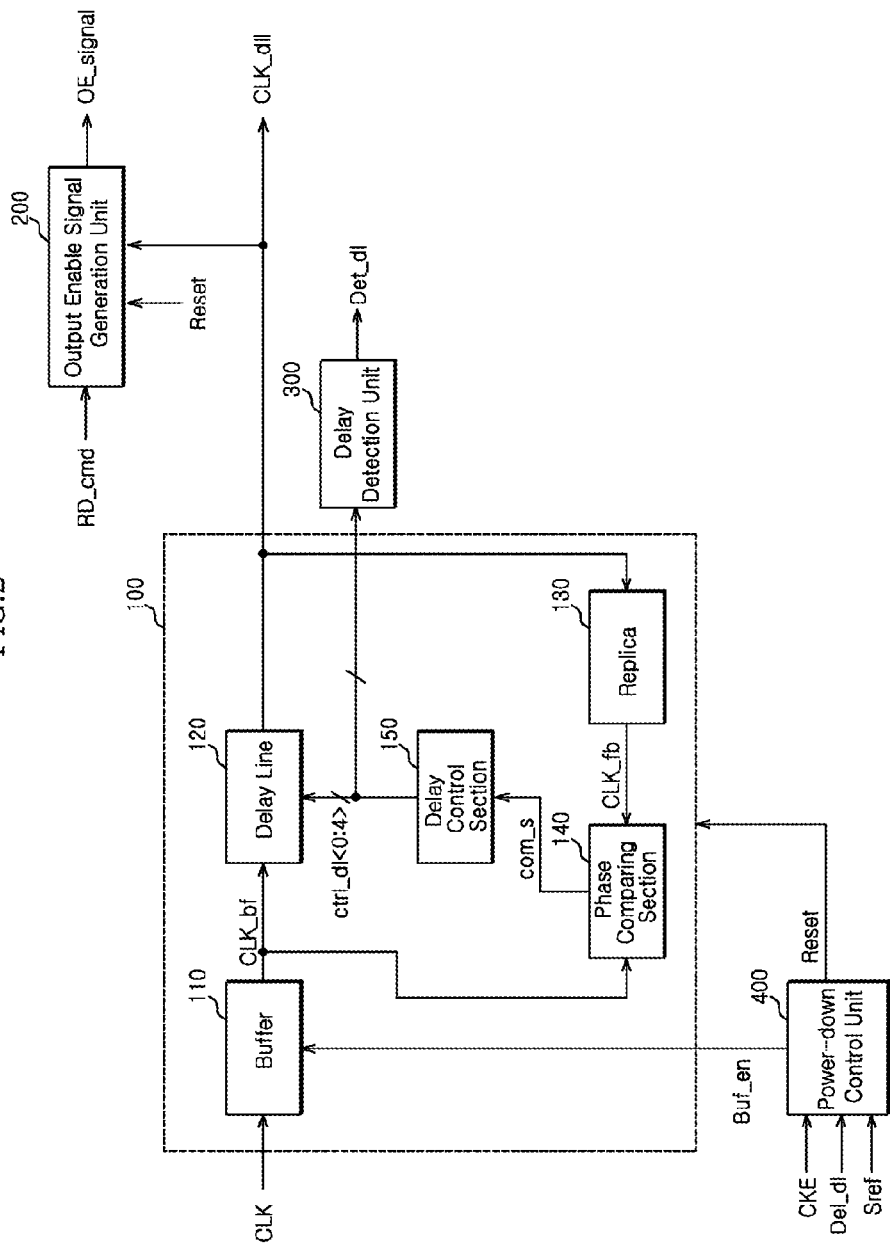
FIG. 2 is a configuration diagram of a semiconductor apparatus in accordance with an embodiment of the present invention.

Referring to FIG. 2, a semiconductor apparatus in accordance with an embodiment of the present invention includes a DLL clock generation unit 100, an output enable signal generation unit 200, a delay detection unit 300, and a power-down control unit 400.

The DLL clock generation unit 100 is configured to compare the phases of a clock CLK and a feedback clock CLK_fb, determine the delay time of a delay line 120, delay the clock CLK by the delay time, and generate a DLL clock CLK_dll. In detail, the DLL is clock generation unit 100 compares the phases of a buffering clock CLK_bf acquired by buffering the clock CLK and the feedback clock CLK_fb, determines the delay time, delays the buffering clock CLK_bf by the delay time, and outputs the DLL clock CLK_dll.

The DLL clock generation unit 100 includes a buffer 110, the delay line 120, a replica 130, a phase comparing section 140, and a delay control section 150.

The buffer 110 is configured to buffer the clock CLK and generate the buffering clock CLK_bf, and is activated or deactivated in response to a buffer enable signal Buf_en. The buffer 110 buffers the clock CLK and generates the buffering clock CLK_bf when activated, and locks the buffering clock CLK_bf to a specified level when deactivated.

The delay line 120 is configured to have a delay time corresponding to first to fifth delay control signals ctrl_dl<0:4>, delay the buffering clock CLK_bf by the delay time, and output the DLL clock CLK_dll.

The replica 130 is configured to delay the DLL clock CLK_dll and generate the feedback clock CLK_fb. The replica 130 has a delay value acquired by modeling the internal delay time of the semiconductor apparatus.

The phase comparing section 140 is configured to compare the phases of the buffering clock CLK_bf and the feedback clock CLK_fb and generate a comparison signal com_s. For example, is the phase comparing section 140 compares the phases of the buffering clock CLK_bf and the feedback clock CLK_fb, enables the comparison signal com_s when the phase of the buffering clock CLK_bf is earlier than the phase of the feedback clock CLK_fb, and disables the comparison signal com_s when the phase of the buffering clock CLK_bf is later than the phase of the feedback clock CLK_fb.

The delay control section 150 is configured to generate the first to fifth delay control signals ctrl_dl<0:4> in response to the comparison signal com_s. For example, the delay control section 150 performs a count-up operation when the comparison signal com_s is enabled and performs a count-down operation when the comparison signal com_s is disabled. The first to fifth delay control signals ctrl_dl<0:4> having an initial value of (0, 0, 1, 0, 0) become (0, 1, 0, 0, 0) when the count-up operation is performed, and become (1, 0, 0, 0, 0) when the count-up operation is consecutively performed. The first to fifth delay control signals ctrl_dl<0:4> having the initial value of (0, 0, 1, 0, 0) become (0, 0, 0, 1, 0) when the count-down operation is performed, and become (0, 0, 0, 0, 1) when the count-down operation is consecutively performed.

The DLL clock generation unit 100 is reset when a reset signal Reset is enabled. For example, all of the buffer 110, the delay line 120, the phase comparing section 140 and the delay control section 150 are reset or initialized when the reset signal Reset is is enabled.

The output enable signal generation unit 200 is configured to generate an output enable signal OE_signal when a read command signal RD_cmd is inputted and a preset cycle of the DLL clock CLK_dll elapses. The output enable signal generation unit 200 as an internal circuit which receives the DLL clock CLK_dll is reset in response to the reset signal Reset.

The delay detection unit 300 is configured to detect the delay time of the delay line 120 and enable a delay detection signal Det_dl when the delay time is greater than or equal to a predetermined time. For example, the delay detection unit 300 decodes the first to fifth delay control signals ctrl_dl<0:4> and enables the delay detection signal Det_dl. In detail, the delay detection unit 300 enables the delay detection signal Det_dl in the cases where the first to fifth delay control signals ctrl_dl<0:4> are (0, 1, 0, 0, 0) and (1, 0, 0, 0, 0).

The power-down control unit 400 is configured to enable the buffer enable signal Buf_en when the delay time of the delay line 120 is greater than or equal to the predetermined time (when the delay detection signal Det_dl is enabled) in a power-down mode, so as to prevent the buffer 110 from being deactivated. The power-down control unit 400 disables the buffer enable signal Buf_en when the delay time of the delay line 120 is less than or equal to the predetermined time (when the delay detection signal Det_dl is is disabled) in the power-down mode, so as to deactivate the buffer 110.

The power-down control unit 400 disables the reset signal Reset when the delay time of the delay line 120 is greater than or equal to the predetermined time (when the delay detection signal Det_dl is enabled) in a self-refresh operation under the power-down mode, and prevents the DLL clock generation unit 100 and the output enable signal generation unit 200 from being reset. The power-down control unit 400 enables the reset signal Reset when the delay time of the delay line 120 is less than or equal to the predetermined time (when the delay detection signal Det_dl is disabled), and allows the DLL clock generation unit 100 and the output enable signal generation unit 200 to be reset.

Figure 3:
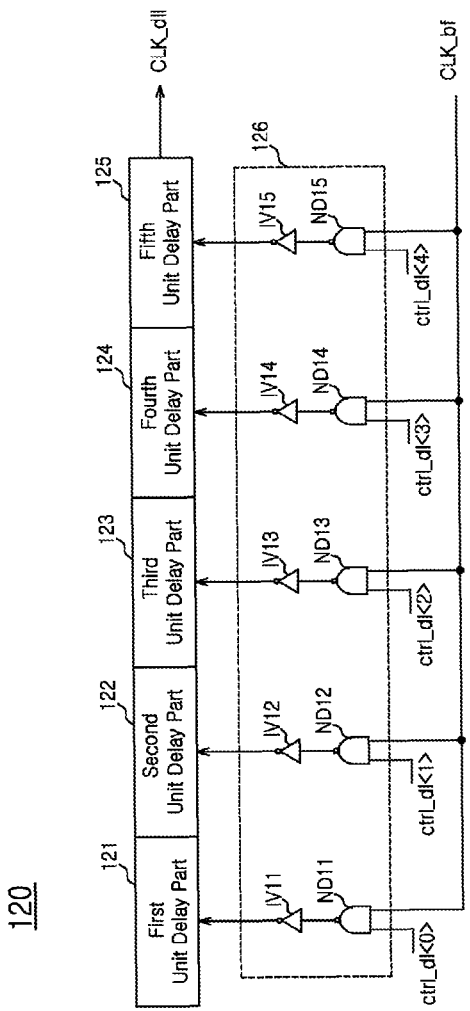
FIG. 3 is a configuration diagram of the delay line of FIG. 2.

Referring to FIG. 3, the delay line 120 includes first to fifth unit delay parts 121 to 125 which are connected in series, and a selection part 126.

The selection part 126 is configured to input the buffering clock CLK_bf to one of the first to fifth unit delay parts 121 to 125 in response to the first to fifth delay control signals ctrl_dl<0:4>. For example, when the first to fifth delay control signals ctrl_dl<0:4> are (0, 0, 1, 0, 0), the selection part 126 inputs the buffering clock CLK_bf to the third unit delay part 123 among the first to fifth unit delay parts 121 to 125. The buffering clock CLK_bf inputted to the third unit delay part 123 is delayed through the third to fifth unit delay parts 123 to 125, and is then outputted as the DLL clock CLK_dll. Similarly, when the first to fifth delay control signals ctrl_dl<0:4> are (0, 1, 0, 0, 0), the selection part 126 inputs the buffering clock CLK_bf to the second unit delay part 122 among the first to fifth unit delay parts 121 to 125. The buffering clock CLK_bf inputted to the second unit delay part 122 is delayed through the second to fifth unit delay parts 122 to 125, and is then outputted as the DLL clock CLK_dll. Similarly, when the first to fifth delay control signals ctrl_dl<0:4> are (1, 0, 0, 0, 0), the selection part 126 inputs the buffering clock CLK_bf to the first unit delay part 121 among the first to fifth unit delay parts 121 to 125. The buffering clock CLK_bf inputted to the first unit delay part 121 is delayed through the first to fifth unit delay parts 121 to 125, and is then outputted as the DLL clock CLK_dll. Similarly when the first to fifth delay control signals ctrl_dl<0:4> are (0, 0, 0, 1, 0), the selection part 126 inputs the buffering clock CLK_bf to the fourth unit delay part 124 among the first to fifth unit delay parts 121 to 125. The buffering clock CLK_bf inputted to the fourth unit delay part 124 is delayed through the fourth and fifth unit delay parts 124 and 125, and is then outputted as the DLL clock CLK_dll. Similarly, when the first to fifth delay control signals ctrl_dl<0:4> are (0, 0, 0, 0, 1), the selection part 126 inputs the buffering clock CLK_bf to the fifth unit delay part 125 among the first to fifth unit delay parts 121 to 125. The buffering clock CLK_bf inputted to the fifth unit delay part 125 is delayed through the fifth unit delay part 125, and is then outputted as the DLL clock CLK_dll.

The selection part 126 includes first to fifth inverters IV11 to IV15, and first to fifth NAND gates ND11 to ND15. The first NAND gate ND11 receives the first delay control signal ctrl_dl<0> and the buffering clock CLK_bf, and the first inverter IV11 outputs the output signal of the first NAND gate ND11 to the first unit delay part 121. Similarly the second NAND gate ND12 receives the second delay control signal ctrl_dl<1> and the buffering clock CLK_bf, and the second inverter IV12 outputs the output signal of the second NAND gate ND12 to the second unit delay part 122. Similarly, the third NAND gate ND13 receives the third delay control signal ctrl_dl<2> and the buffering clock CLK_bf, and the third inverter IV13 outputs the output signal of the third NAND gate ND13 to the third unit delay part 123. Similarly, the fourth NAND gate ND14 receives the fourth delay control signal ctrl_dl<3> and the buffering clock CLK_bf, and the fourth inverter IV14 outputs the output signal of the fourth NAND gate ND14 to the fourth unit delay part 124. Similarly, the fifth NAND gate ND15 receives the fifth delay control signal ctrl_dl<4> and the buffering clock CLK_bf, and the fifth inverter IV15 outputs the output signal of the fifth NAND gate ND15 to the fifth unit delay part 125.

Figure 4:
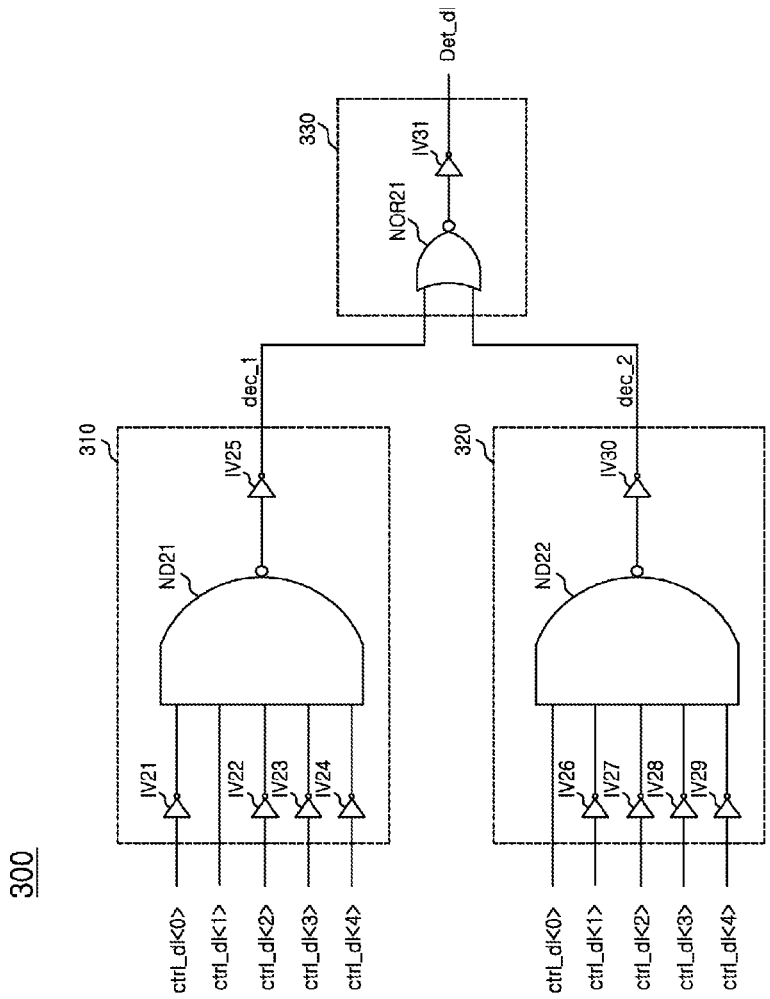
FIG. 4 is a configuration diagram of the delay detection unit of FIG. 2.

Referring to FIG. 4, the delay detection unit 300 includes a first decoding section 310, a second decoding section 320, and a signal combining section 330.

The first decoding section 310 is configured to enable a first decoding signal dec_1 when the first to fifth delay control signals ctrl_dl<0:4> have a first preset value. For example, the first decoding section 310 enables the first decoding signal dec_1 when the first to fifth delay control signals ctrl_dl<0:4> have the first preset value of (0, 1, 0, 0, 0).

The first decoding section 310 includes sixth to tenth inverters IV21 to IV25, and a sixth NAND gate ND21. The sixth inverter IV21, the seventh inverter IV22, the eighth inverter IV23, and the ninth inverter IV24 receives the first delay control signal ctrl_dl<0>, the third delay control signal ctrl_dl<2>, the fourth delay control signal ctrl_dl<3>, and the fifth delay control signal ctrl_dl<4>, respectively. The sixth NAND gate ND21 receives the output signals of the sixth to ninth inverters IV21 to 1V24, and the second delay control signal ctrl_dl<1>. The tenth inverter IV25 receives the output signal of the sixth NAND gate ND21 and outputs the first decoding signal dec_1.

Similarly, the second decoding section 320 is configured to enable a second decoding signal dec_2 when the first to fifth delay control signals ctrl_dl<0:4> have a second preset value. For example, the second decoding section 320 enables the second decoding signal dec_2 when the first to fifth delay control signals ctrl_dl<0:4> have the second preset value of (1, 0, 0, 0, 0).

The second decoding section 320 includes eleventh to fifteenth inverters IV26 to IV30, and a seventh NAND gate ND22. The eleventh inverter IV26, the twelfth inverter IV127, the thirteenth inverter IV128, the fourteenth inverter IV129, and the fifteenth inverter IV130 receives the second delay control signal ctrl_dl<1>, the third delay control signal ctrl_dl<2>, the fourth delay control signal ctrl_dl<3>, and the fifth delay control signal ctrl_dl<4>, respectively. The seventh NAND gate ND22 receives the output signals of the eleventh to fourteenth inverters IV26 to IV29, and the first delay control signal ctrl_dl<0>. The fifteenth inverter IV30 receives the output signal of the seventh NAND gate ND22 and outputs the second decoding signal dec_2.

The signal combining section 330 is configured to enable the delay detection signal Det_dl when any one of the first and second decoding signals dec_1 and dec_2 is enabled.

The signal combining section 330 includes a NOR gate NOR21, and a sixteenth inverter IV31. The NOR gate NOR21 receives the first and second decoding signals dec_1 and dec_2, and the sixteenth inverter IV31 receives the output signal of the NOR gate NOR21 and outputs the delay detection signal Det_dl.

Figure 5:
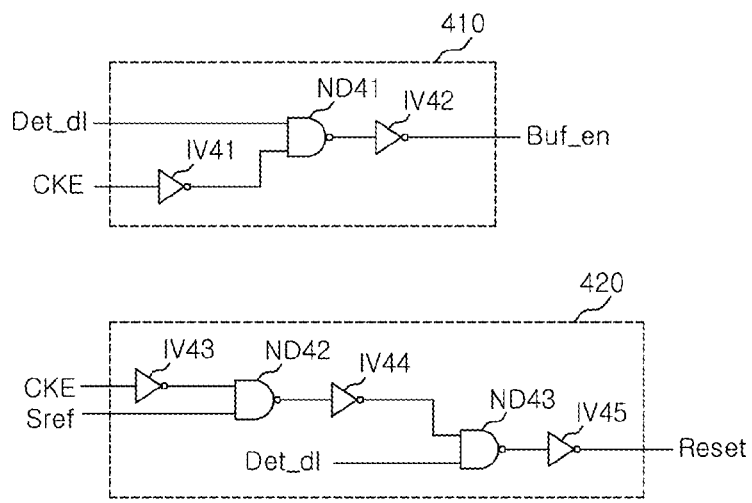
FIG. 5 is a configuration diagram of the power-down control unit of FIG. 2.

Referring to FIG. 5, the power-down control unit 400 includes a buffer enable signal generating section 410, and a reset signal generating section 420.

The buffer enable signal generating section 410 is configured to enable the buffer enable signal Buf_en and activate the buffer 110 when the delay detection signal Det_dl is enabled in the power-down mode, and is also configured to disable the buffer enable signal Buf_en and deactivate the buffer 110 when the delay detection signal Det_dl is disabled in the power-down mode.

The buffer enable signal generating section 410 includes seventeenth and eighteenth inverters IV41 and IV42, and an eighth NAND gate ND41. The seventeenth inverter IV41 receives the clock enable signal CKE. The eighth NAND gate ND41 receives the delay detection signal Det_dl and the output signal of the seventeenth inverter IV41. The eighteenth inverter IV42 receives the output signal of the eighth NAND gate ND41 and outputs the buffer enable signal Buf_en.

The reset signal generating section 420 is configured to generate the reset signal Reset in response to the delay detection signal Det_dl when a self-refresh mode is entered from the power-down mode. For example, the reset signal generating section 420 disables the reset signal Reset when the delay detection signal Det_dl is enabled after entry is made to the self-refresh mode from the power-down mode. Also, the reset signal generating section 420 enables the reset signal Reset when the delay detection signal Det_dl is disabled after entry is made to the self-refresh mode from the power-down mode.

The reset signal generating section 420 includes nineteenth to twenty first inverters IV43 to IV45, and ninth and tenth NAND gates ND42 and ND43. The nineteenth inverter IV43 receives the clock enable signal CKE. The ninth NAND gate ND42 receives the output signal of the nineteenth inverter IV43 and a self-refresh signal Sref. The twentieth inverter IV44 receives the output signal of the ninth NAND gate ND42. The tenth NAND gate ND43 receives the output signal of the twentieth inverter IV44 and the delay detection signal Det_dl. The twenty first inverter IV45 receives the output signal of the tenth NAND gate ND43 and outputs the reset signal Reset.

Operations of the semiconductor apparatus in accordance with embodiments of the present invention, configured as mentioned above, will be described below.

The buffer 110 receives the clock CLK and outputs the buffering clock CLK_bf.

The delay line 120 has the delay time according to the first to fifth delay control signals ctrl_dl<0:4>, delays the buffering clock CLK_bf by the delay time, and outputs the DLL clock CLK_dll.

The replica 130 delays the DLL clock CLK_dll and outputs the feedback clock CLK_fb.

The phase comparing section 140 compares the phases of the buffering clock CLK_bf and the feedback clock CLK_fb, and generates the comparison signal com_s.

The delay control section 150 generates the first to fifth delay control signals ctrl_dl<0:4> in response to the comparison is signal com_s.

The delay detection unit 300 generates the delay detection signal Det_dl in response to the first to fifth delay control signals ctrl_dl<0:4>.

When the semiconductor apparatus enters the power-down mode, the clock enable signal CKE is disabled.

If the first to fifth delay control signals ctrl_dl<0:4> have the value of (1, 0, 0, 0, 0) or (0, 1, 0, 0, 0), the delay detection unit 300 enables the delay detection signal Det_dl. In detail, in the case where the first to fifth delay control signals ctrl_dl<0:4> have the value of (1, 0, 0, 0, 0), as all the first to fifth unit delay parts 121 to 125 of the delay line 120 serve as delay elements, the delay line 120 has a maximum delay time. Further, in the case where the first to fifth delay control signals ctrl_dl<0:4> have the value of (0, 1, 0, 0, 0), as the second to fifth unit delay parts 122 to 125 of the delay line 120 serve as delay elements, the delay line 120 has a delay time one step short of the maximum delay time possible.

When the delay time of the delay line 120 is greater than or equal to the predetermined time, that is, when at least four unit delay parts serve as delay elements, the delay detection signal Det_dl is enabled.

The power-down control unit 400 generates the buffer enable signal Buf_en in response to the delay detection signal Det_dl when the clock enable signal CKE is disabled. In detail, the power-down control unit 400 enables the buffer enable signal Buf_en when the clock enable signal CKE is disabled and the delay detection signal Det_dl is enabled, and disables the buffer enable signal Buf_en when the clock enable signal CKE is disabled and the delay detection signal Det_dl is disabled.

The semiconductor apparatus in accordance with an embodiment of the present invention is configured to activate or deactivate the buffer of the DLL clock generation unit (circuit) according to the delay amount of the delay line in the power-down mode. In the conventional semiconductor apparatus, as operations for entering and exiting the power-down mode are repeated, the DLL clock generation unit is repeatedly activated and deactivated, and a misoperation may occur due to such repeated operations. In particular, in the conventional semiconductor apparatus, as the delay amount (delay time) of the delay line of the DLL clock generation unit increases, the probability of a misoperation to occur increases. In the semiconductor apparatus in accordance with an embodiment of the present invention, the buffer is activated only in the case where the delay amount of the delay line is greater than or equal to a predetermined delay amount even when the power-down mode is entered, to activate the DLL clock generation unit, as a result of which the occurrence of a misoperation is reduced. In addition, the semiconductor apparatus in accordance with an embodiment of the present invention performs an operation of deactivating the buffer in is the case where the delay amount of the delay line is less than or equal to the predetermined delay amount when the power-down mode is entered.

The power-down control unit 400 generates the reset signal Reset in response to the delay detection signal Det_dl when the clock enable signal CKE is disabled and the self-refresh signal Sref is enabled. The power-down control unit 400 disables the reset signal Reset when the delay detection signal Det_dl is enabled in the case where the clock enable signal CKE is disabled and the self-refresh signal Sref is enabled. On the other hand, the power-down control unit 400 enables the reset signal Reset when the delay detection signal Det_dl is disabled in the case where the clock enable signal CKE is disabled and the self-refresh signal Sref is enabled. If the reset signal Reset is enabled, the DLL clock generation unit 100 and the output enable signal generation unit (internal circuit) 200 are reset or initialized.

The semiconductor apparatus in accordance with an embodiment of the present invention is configured to activate or deactivate the DLL clock generation unit 100 and the output enable signal generation unit 200 according to the delay amount of the delay line when the self-refresh operation is performed in the power-down mode. In the conventional semiconductor apparatus, as the self-refresh operation is frequently performed in the power-down mode, the DLL clock generation unit and the internal circuit (the output enable signal generation unit) using the DLL clock CLK_dll repeat initializing operations, and due to these repeated operations, a misoperation is likely to occur. In particular, as the delay amount (delay time) of the delay line of the DLL clock generation unit increases, the probability of a misoperation to occur increases. In the semiconductor apparatus in accordance with the embodiment of the present invention, when the self-refresh operation is frequently performed in the power-down mode, the initializing operations of the DLL clock generation unit 100 and the internal circuit (the output enable signal generation unit 200) are not performed when the delay amount of the delay line is greater than or equal to the predetermined delay amount, thereby reducing the occurrence of the misoperation. Further, in the semiconductor apparatus in accordance with an embodiment of the present invention, when the self-refresh operation is performed in the power-down mode, if the delay amount of the delay line is less than or equal to the predetermined amount, the operation to initialize the DLL clock generation unit 100 and the internal circuit is performed.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the is claims that follow when taken in conjunction with the above description and accompanying drawings.

What is claimed is:

1. A semiconductor apparatus comprising:
   a delay-locked loop (DLL) clock generation unit configured to compare phases of a clock and a feedback clock, determine a delay time of a delay line, delay the clock by the delay time through the delay line, and generate a DLL clock;
   a delay detection unit configured to detect the delay time of the delay line and enable a delay detection signal when the delay time is greater than or equal to a predetermined time; and
   a power-down control unit configured to prevent the DLL clock generation unit from being reset when the delay detection signal is enabled and reset the DLL clock generation unit when the delay detection signal is disabled, in a self-refresh operation under a power-down mode.

2. The semiconductor apparatus according to claim 1, wherein the DLL clock generation unit is reset in response to a reset signal.

3. The semiconductor apparatus according to claim 2, wherein the DLL clock generation unit comprises:
   the delay line configured to have the delay time corresponding to a plurality of delay control signals, delay the clock by the delay time, and generate the DLL clock;
   a replica configured to delay the DLL clock and output the feedback clock;
   a phase comparing section configured to compare the phases of the clock and the feedback clock and generate a comparison signal; and
   a delay control section configured to generate the plurality of delay control signals in response to the comparison signal.

4. The semiconductor apparatus according to claim 3, wherein the delay detection unit generates the delay detection signal by decoding the plurality of delay control signals.

5. The semiconductor apparatus according to claim 4, wherein the power-down control unit generates the reset signal in response to the delay detection signal in the self-refresh operation under the power-down mode.

6. The semiconductor apparatus according to claim 5, wherein the power-down control unit disables the reset signal when the delay detection signal is enabled in the case where a clock enable signal is disabled and a self-refresh signal is enabled, and enables the reset signal when the delay detection signal is disabled in the case where the clock enable signal is disabled and the self-refresh signal is enabled.

7. The semiconductor apparatus according to claim 5, further comprising:
   an output enable signal generation unit configured to be reset in response to the reset signal, receive a read signal, and generate an output enable signal when a preset cycle of the DLL clock elapses.

8. A semiconductor apparatus comprising:
   a buffer configured to buffer a clock and generate a buffering clock;
   a delay line configured to determine a delay time in response to a plurality of delay control signals, delay the buffering clock by the determined delay time, and output a delay-locked loop (DLL) clock;
   a replica configured to delay the DLL clock and output a feedback clock;
   a phase comparing section configured to compare phases of the buffering clock and the feedback clock and generate a comparison signal;
   a delay control section configured to generate the plurality of delay control signals in response to the comparison signal;
   a delay detection unit configured to generate a delay detection signal in response to the plurality of delay control signals; and
   a power-down control unit configured to activate or deactivate the buffer in response to the delay detection signal in a power-down mode.

9. The semiconductor apparatus according to claim 8, wherein the buffer is activated or deactivated in response to a buffer enable signal, and
   wherein, when activated, the buffer buffers the clock and generates the buffering clock.

10. The semiconductor apparatus according to claim 9, wherein the power-down control unit activates the buffer when the delay detection signal is enabled in the power-down mode, and
    wherein the power-down control unit deactivates the buffer when the delay detection signal is disabled in the power-down mode.

11. The semiconductor apparatus according to claim 10, wherein the power-down control unit enables the buffer enable signal and activates the buffer when a clock enable signal is disabled and the delay detection signal is enabled, and
    wherein the power-down control unit disables the buffer enable signal and deactivates the buffer when the clock enable signal and delay detection signal are disabled.

12. The semiconductor apparatus according to claim 8, wherein the power-down control unit activates or deactivates the buffer in response to the delay detection signal in the power-down mode,
    wherein the power-down control unit prevents the buffer, the delay line, the delay control section and the phase comparing section from being reset when a self-refresh mode is entered from the power-down mode and the delay detection signal is enabled, and
    wherein the power-down control unit resets the buffer, the delay line, the delay control section and the phase comparing section when the self-refresh mode is entered from the power-down mode and the delay detection signal is disabled.

13. The semiconductor apparatus according to claim 12, wherein the power-down control unit enables a buffer enable signal and activates the buffer when a clock enable signal is disabled and the delay detection signal is enabled,
    wherein the power-down control unit disables the buffer enable signal and deactivates the buffer when the clock enable signal and the delay detection signal are disabled,
    wherein the power-down control unit disables a reset signal and prevents the buffer, the delay line, the delay control section and the phase comparing section from being reset when the clock enable signal is disabled, and the delay detection signal and a self-refresh signal are enabled,
    wherein the power-down control unit enables the reset signal and resets the buffer, the delay line, the delay control section and the phase comparing section when the clock enable signal, the delay detection signal, and the self-refresh signal are disabled.

14. The semiconductor apparatus according to claim 13, further comprising:
    an internal circuit configured to receive the DLL clock and reset in response to the reset signal.

* * * * *